APPARATUS FOR ATTACHING LEADS TO ELECTRICAL COMPONENTS

Filed May 28, 1963 5 Sheets-Sheet 1

INVENTORS
L.R.HAGNER
G.O.STEGNER
BY A. C. Schwarz, Jr.
ATTORNEY

Dec. 27, 1966 L. R. HAGNER ET AL 3,294,950

APPARATUS FOR ATTACHING LEADS TO ELECTRICAL COMPONENTS

Filed May 28, 1963 5 Sheets-Sheet 2

Dec. 27, 1966 L. R. HAGNER ET AL 3,294,950

APPARATUS FOR ATTACHING LEADS TO ELECTRICAL COMPONENTS

Filed May 28, 1963 5 Sheets-Sheet 3

Dec. 27, 1966 L. R. HAGNER ET AL 3,294,950

APPARATUS FOR ATTACHING LEADS TO ELECTRICAL COMPONENTS

Filed May 28, 1963 5 Sheets-Sheet 4

APPARATUS FOR ATTACHING LEADS TO ELECTRICAL COMPONENTS

Filed May 28, 1963 5 Sheets-Sheet 5

United States Patent Office 3,294,950

Patented Dec. 27, 1966

3,294,950
APPARATUS FOR ATTACHING LEADS TO ELECTRICAL COMPONENTS

Lawrence R. Hagner, Downers Grove, and Gustav O. Stegner, Naperville, Ill., assignors to Western Electric Company, Incorporated, New York, N.Y., a corporation of New York Filed May 28, 1963, Ser. No. 283,898
8 Claims. (Cl. 219—103)

This invention relates to an apparatus for attaching leads to electrical components, and more particularly to an apparatus for feeding, heating and pressing leads into solder terminals of electrical components to bond the leads thereto.

An object of the present invention is to provide an apparatus for attaching leads to electrical components.

Another object of the invention is the provision of an apparatus for feeding, heating, and bonding leads to electrical components.

Apparatus illustrating certain aspects of the invention may include a horizontal feed tube into which a headed lead is positioned and is advanced therethrough by air to a pair of open transfer jaws and is supported in a predetermined position thereon. A first actuator connected to the upper one of the jaws is operated to effect the closing of the jaws and the movement thereof to a predetermined position with the lead in close proximity to a first electrode and coincident with the centerline of an electrical component that is supported by a carried in a lead attaching station. The first electrode, a second electrode, and an actuator for the latter are mounted on a carriage. The second electrode is actuated to grip the lead against the first electrode, whereupon the first actuator is operated to effect the opening of the jaws and the retraction thereof to the feed tube. The electrodes are connected to a source of electrical potential for a selected period of time to effect the heating of the lead, and a third actuator is operated to move the carriage toward the electrical component to press the headed end of the heated lead against a solder terminal on the component to effect the bonding of the lead thereto. After the lead has cooled, the electrodes are actuated to release the lead, after which the carriage is returned.

Other objects, advantages and novel aspects of the invention will become apparent upon consideration of the following detailed description, in conjunction with the accompanying drawings, in which.

Figures 1, 2:
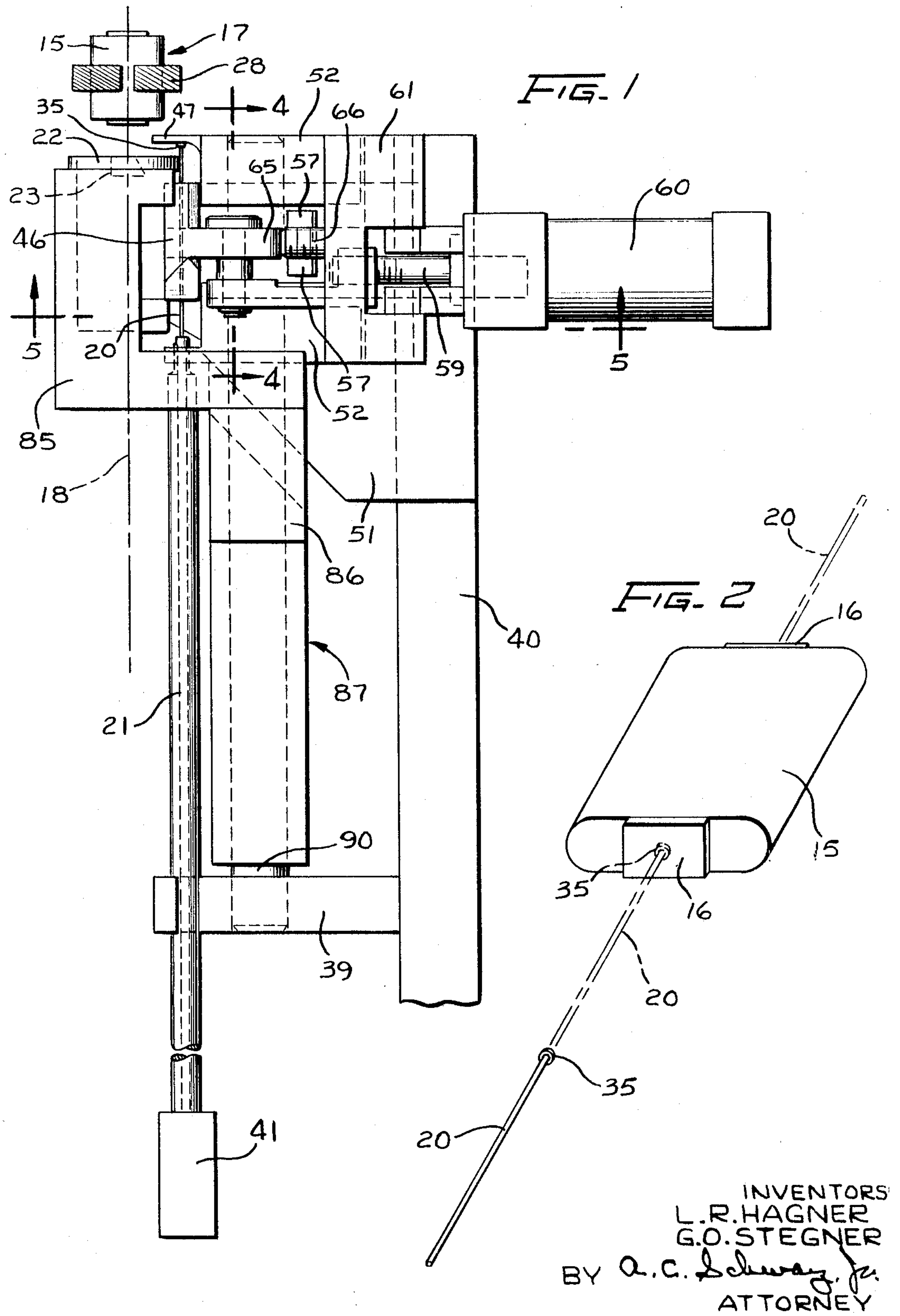
FIG. 1 is a fragmentary plan view of the apparatus showing the lead transfer jaw in a retracted position.
FIG. 2 is a perspective view of an electrical component and a headed lead therefor.
Figures 3, 4:
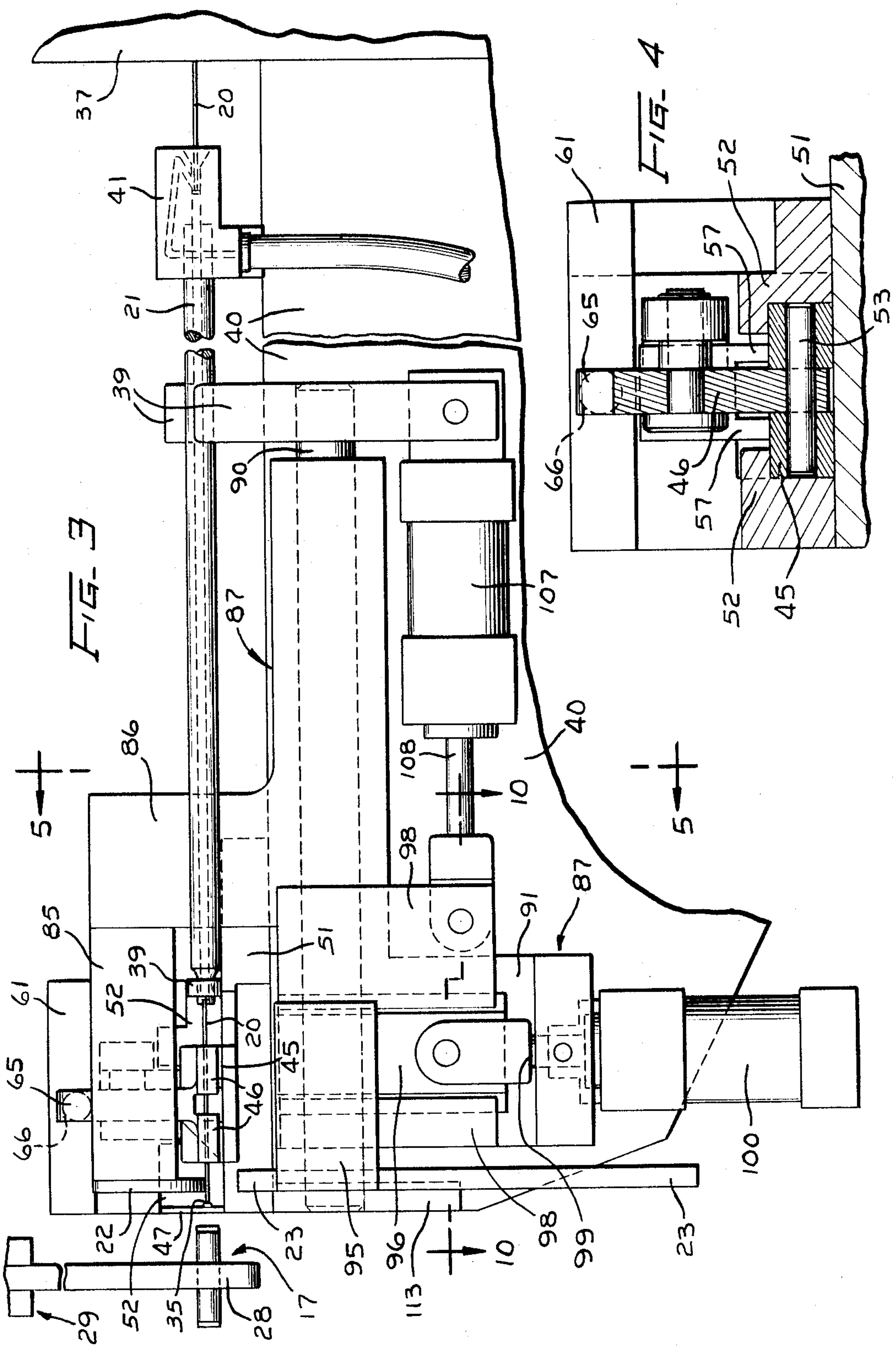
FIG. 3 is a fragmentary side elevational view of the lead attaching apparatus as viewed from the left of FIG. 1.
FIG. 4 is an enlarged fragmentary sectional view of the apparatus taken on the line 4—4 of FIG. 1.

The present lead attaching apparatus is designed to advance successive electrical components 15 (FIGS. 1–3), each having terminal blocks 16 of solder formed on the ends thereof, to a predetermined position at a lead attaching station 17 with the centerline of the component extending through the terminal blocks in alignment with a predetermined axis 18, feed successive leads 20 along a path through a feed tube 21 parallel to said axis and in laterally spaced relation thereto to a transfer position adjacent the component 15, move the lead 20 laterally into coincident relation with the axis 18 and between a pair of heating electrodes 22 and 23 (FIG. 3), actuate the electrode 23 to grip the lead 20 adjacent the leading end thereof against the electrode 23, to heat the lead, move the electrodes and the heated lead 20 axially to press the end of the lead into engagement with the terminal block 16, and hold the lead in such position until the lead 20 cools, to effect the bonding of the lead 20 to the component 15.

The electrical components, as disclosed herein, are in the form of flattened wound capacitors which are loaded into holders 28 of a carrier 29 (FIG. 9) that is mounted for rotation about a horizontal axis and is indexed to advance the holders to successive stations including the lead attaching station 17. As shown diagrammatically in FIG. 9, the carrier 29 is indexed by mechanism including a Geneva drive, the driving element 32 of which is secured to a drive shaft 33.

Each of the leads 20 is formed with an enlarged flat head 35 by a lead forming device 37 (FIG. 9) and the leads are placed successively with the headed portion thereof in one end of the feed tube 21. The feed tube is supported in parallel and laterally offset relation to the axis 18 (FIG. 1) by brackets 39, one of which is mounted on a stationary vertical frame plate 40. Compressed air from a suitable source is supplied to a head 41 at one end of the feed tube and serves to move the lead 20 through the feed tube into a space between a pair of transfer jaws 45 and 46 and into engagement with a stationary stop member 47 on the frame 40. The lead 20 is stopped with the head 35 adjacent to the capacitor 15 (FIG. 1) and is supported on a horizontal ledge of a groove 49 formed on the forward upper end portion of the lower jaw 45 (FIG. 5).

The jaw 45 is in the form of an elongated member which is supported on a horizontal frame member 51 on the frame 40 and is guided between gibs 52 for horizontal movement toward and from the axis 18 along a path perpendicular thereto. The upper jaw 46 is connected to the lower jaw 45 for pivotal movement about a pin 53 to and from a closed position indicated in dotted lines at 55 in FIG. 6 and an open position indicated in dot and dashed lines at 56. In the latter position the jaw is stopped by the engagement of a lug 57 on the upper jaw 46 with the lower jaw 45. Pivotally connected to the upper jaw 46 is one end of a piston rod 59 of a fluid-operated actuator 60 that is secured to a support 61 on the frame 40. Air is admitted selectively to opposite ends of the transfer jaw actuator 60 under control of a solenoid-operated valve 63 (FIG. 9) to reciprocate the piston rod 59.

Figure 5:
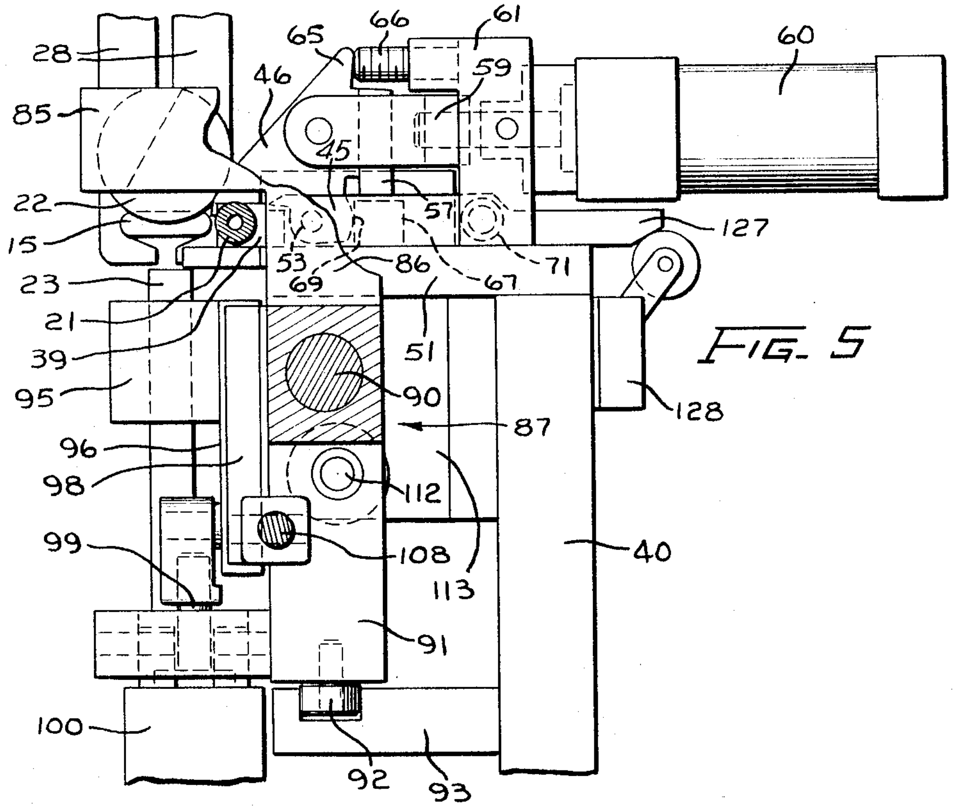
FIG. 5 is a vertical cross-sectional view of the apparatus taken along the line 5—5 of FIG. 1.
Figure 7:
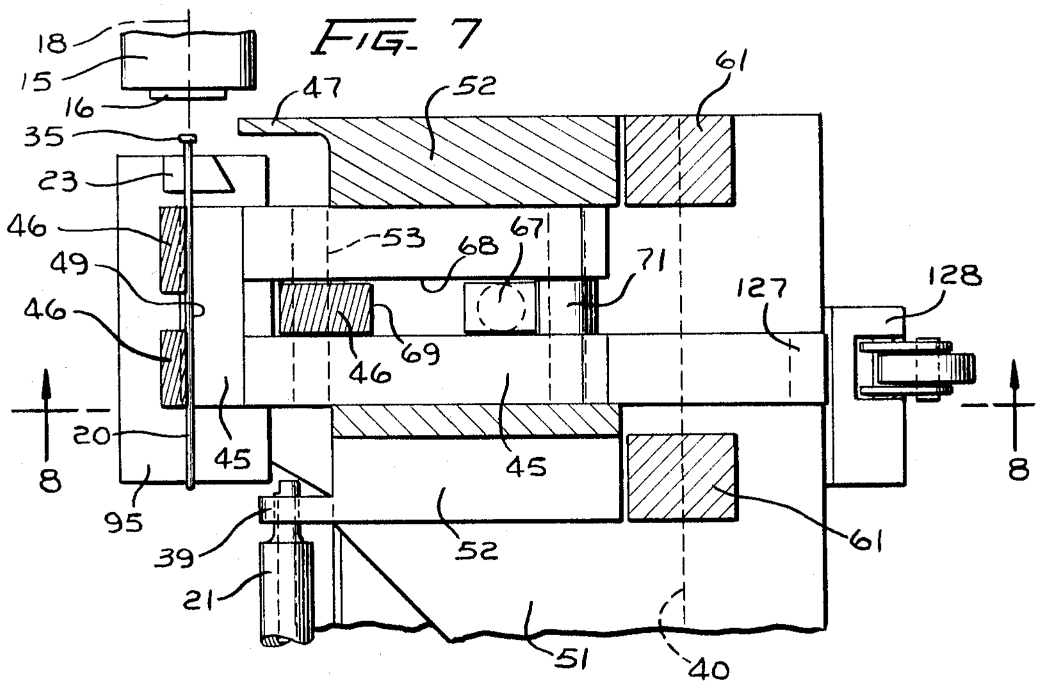
FIG. 7 is an enlarged fragmentary plan sectional view of the apparatus taken on the line 7—7 of FIG. 8 and showing the transfer jaws in advanced position for supporting the lead in alignment with the electrical component.
Figure 8:
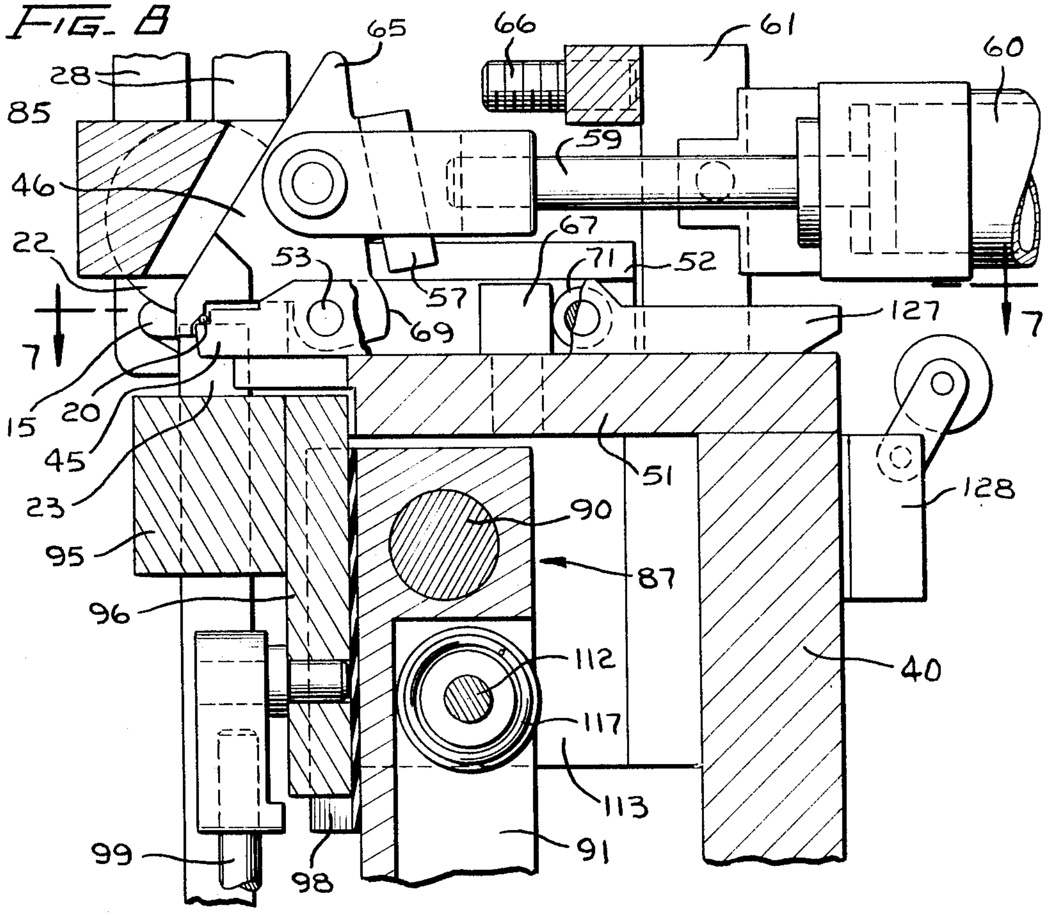
FIG. 8 is a fragmentary vertical cross-sectional view of the apparatus taken the line 8—8 of FIG. 7.

During the return movement of the rod 59, the upper jaw 46 is first pivoted to a fully open position, after which the jaws 45 and 46 move together until the upper extremity 65 of the jaw 46 engages a stop 66 on the support 61 (FIGS. 5 and 8). The piston rod 59 continues its return movement for a limited distance until a stop lug 67 (FIGS. 7 and 8), which is mounted on the member 51 and extends into a slot 68 of the lower jaw 45 engages a curved surface 69 on the upper jaw 46 adjacent the pivot pin 53, during which continued movement the upper jaw 46 pivots in a counterclockwise direction about the pivot pin 53 to an intermediate position 70 indicated in full lines in FIG. 6. The stop lug 67 also engages a stop member 71 on lower jaw 45 to stop it in the forward position with the lead 20 coincident with the axis 18. As shown particularly in FIG. 6, the upper jaw 46 at its forward end is provided with a downwardly directed portion or lip 75 which has a rabbeted portion formed by the oblique surface 77 and a downwardly extending surface 78. As the jaw 46 moves to the closed position 50 the oblique surface 77 serves to engage the shank portion of the lead 20 and move it against the vertical surface of the groove 49 into a predetermined position on the lower jaw 45.

Figure 6:
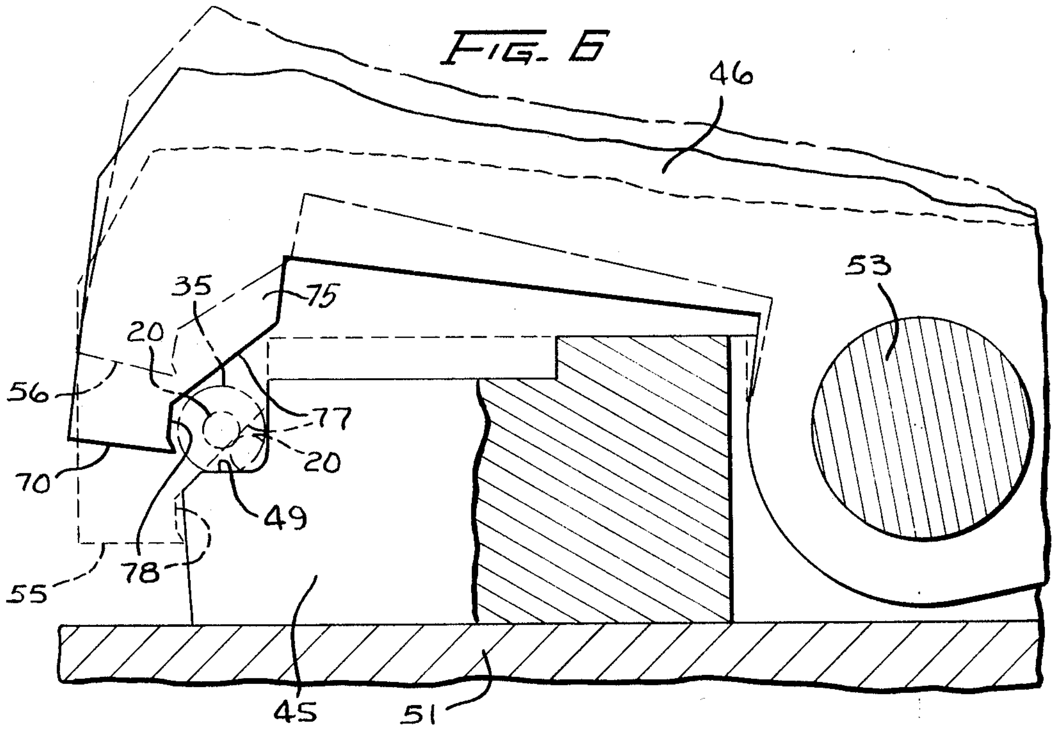
FIG. 6 is a greatly enlarged view of a portion of the transfer jaws indicating several positions of the upper movable jaw.

In the intermediate portion 70 of the upper jaw 46 when the transfer jaws are in their retracted loading position, the rabbeted portions of the lower and the upper jaws form a passageway as shown in FIG. 6 which is of a size to receive the headed end of the lead 20 as it leaves the feed tube 21 and to guide the headed end across the jaws into engagement with the stop 47. With the upper jaw 46 in open position 56, the lower end portion 75 of the jaw is disposed above the lead 20 to provide clearance for the return of the jaws 45 and 46 without the lead. With the jaw 46 in its closed position 55, the transfer jaws support the lead in a predetermined position therebetween and serve to locate the lead in coaxial relation to the axis 18 when the transfer jaws are moved into the forward position (FIGS. 7 and 8).

The upper transfer jaw 46 is rocked about the pivot pin 53 into closed position 55 during the first portion of the forward movement of the piston rod 59 and thereafter the transfer jaws 45 and 46 are advanced to carry the lead 20 from the loading position at the feed tube 21 (FIGS. 1 and 5) to the forward position in alignment with the capacitor 15. In the forward position of the transfer jaws, the lead 20 is supported below and in close proximity to the upper electrode 22 and above the lower electrode 23. The upper electrode 22 is of circular contour and is mounted on an L-shaped metal block 85 as viewed from above (FIG. 1), which block is secured in insulated relation to an upstanding portion 86 of a carriage 87. The carriage is supported on a rod 90 for horizontal movement parallel to the first axis 18, the rod 90 being supported at its ends in suitable members mounted on the vertical frame plate 40. A downwardly extending portion 91 (FIG. 5) of the carriage has a key 92 slidable in a keyway of a frame member 93 for holding the carriage 87 against rocking movement about the rod 90.

Figures 9, 10:
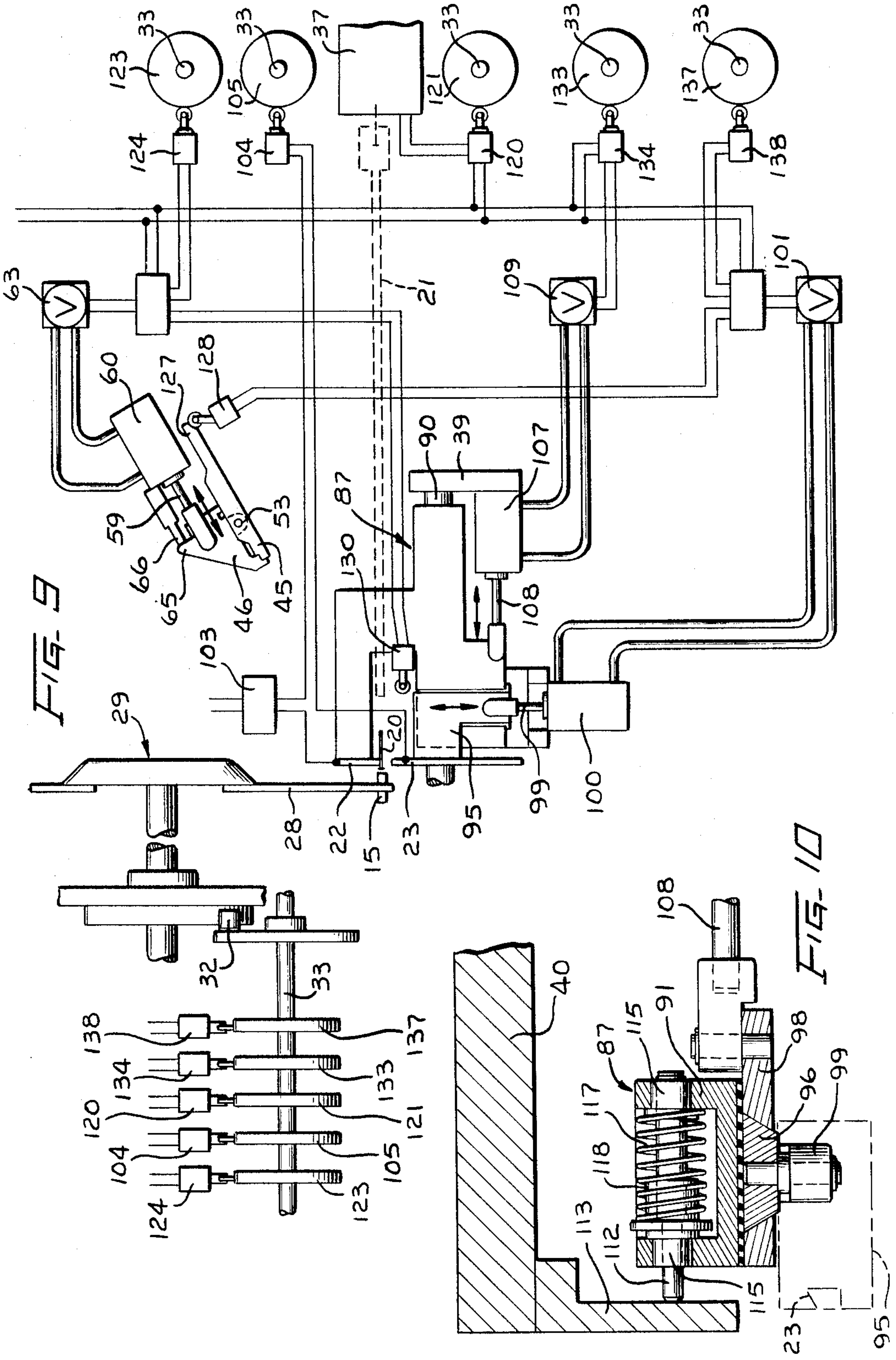
FIG. 9 is a diagrammatic view showing the actuating and control mechanisms of the apparatus.
FIG. 10 is a fragmentary sectional view of the apparatus taken on the line 10—10 of FIG. 3.

Referring to FIGS. 3, 5, 7 and 8, the lower electrode 23 is supported in a holder 95 which is mounted on a slide 96 for vertical movement on the carriage 87. The slide 96 is movable in a dovetailed guideway formed by guide members 98 on the carriage 87 (FIG. 10) and is connected to a piston rod 99 of a fluid-operated actuator 100 that is secured to the carriage 87. Compressed air is selectively admitted to opposite ends of the actuator 100 under control of a solenoid-operated valve 101 (FIG. 9) to effect the vertical movement of the lower electrode 23 selectively into engagement with the lead 20 adjacent the head 35 thereof and the clamping of the lead against the upper electrode 22. The electrodes 22 and 23 are connected to a suitable source of electrical potential 103 through a switch 104 (FIG. 9). The switch 104 is actuated by a cam 105 on the shaft 33 to effect the heating of the lead for a predetermined period of time which begins prior to the longitudinal movement of the lead into engagement with the solder terminal 16 of the capacitor 15.

Longitudinal movement is imparted to the carriage 87 by a fluid-operated actuator 107 (FIG. 3) which is supported at one end on the frame member 39 and has a piston rod 108 connected to one of the guide members 98 on the carriage. Compressed air is admitted to opposite ends of the actuator 107 under control of a solenoid-operated valve 109 to effect the reciprocation of the carriage, during the forward movement of which the heated headed end portion of the lead 20 is pressed into engagement with the solder terminal 16 of the capacitor 15.

To aid in bringing the piston rod 108 to a gentle stop at the end of its travel, a spring-loaded plunger 112 (FIG. 10) is supported on the carriage 87 and is moved into engagement with a stop member 113 on the frame plate 40. The plunger is slidably supported in apertures 115 formed in spaced ribs on the depending portion 91 of the carriage. A compression spring 117 interposed between one of the ribs of the carriage and an adjustable collar 118 on the plunger maintains the plunger in a normal advanced position on the carriage.

Indicated in FIG. 9 is a control mechanism for effecting the sequential operation of the several units of the apparatus which will be described in connection with one cycle of operation of the apparatus. Under control of a switch 120 actuated by a cam 121 on the drive shaft 33 the device 37 ejects a lead 20 and places the headed end thereof in the feed tube 21 in the path of the stream of compressed air therein. With the transfer jaws 45 and 46 in retracted position and with the upper jaw 46 in its intermediate position 70, the lead is advanced by the air through the feed tube into the space between the transfer jaws 45 and 46 and into engagement with the stop 47 and comes in the groove 49 on the lower jaw 45 with the head 35 of the lead located adjacent to the capacitor 15 in the lead attaching station 17. Thereafter a cam 123 on the drive shaft 33 actuates a switch 124 to effect the shifting of the valve 63 and the operation of the actuator 60 to advance the piston rod 59. This causes the upper jaw 46 to pivot to its closed position, shown at 55, to grip the lead 20 against the lower jaw 45 and thereafter to move the transfer jaws from the loading position at the feed tube 21 (FIG. 1) to the forward position (FIGS. 7 and 8) to place the lead 20 in alignment with the capacitor 16 and between the electrodes 22 and 23 and in close proximity to the former.

In response to the movement of the transfer jaws to the forward position, a switch actuating cam 127 on the lower jaw 45 rides off and effects the actuation of a switch 128. Actuation of the switch 128 effects the shifting of the valve 101 and the operation of the actuator 100 to raise the lower electrode 23, through the piston rod 99, to clamp the lead 20 against the upper electrode 22. Upon movement of the lower electrode into clamping engagement with the lead, the holder 95 of the lower electrode actuates a switch 130 supported in its path on the carriage 87. The actuation of the switch effects the reversal of the valve 63 and the operation of the actuator 60 to open the upper jaw and to return the transfer jaws from the forward position to the retracted or loading position leaving the lead 20 firmly held by the electrodes 22 and 23 in alignment with and adjacent to the capacitor 15. During the initial portion of the return movement of the piston rod 59 of the actuator 60, the upper jaw is moved to its open position and as the piston rod 59 nears the ends of its stroke the upper jaw engages the stop 66 and is caused to rock to its intermediate position as the lower jaw 45 continues its return movement through a relatively short distance into engagement with the stop 67.

After the lead 20 has been gripped between the electrodes 22 and 23, the cam 105 on the drive shaft 33 actuates the switch 104 to connect the electrodes to the source of electrical potential 103 for a predetermined period of time to effect the heating of the lead to a predetermined temperature. After the lead has been heated to the required temperature and while it is still being heated a cam 133 on the drive shaft 33 actuates a switch 134 to effect the shifting of the valve 109, the operation of the actuatqr 107, and the axial movement of the carriage 87 in a forward direction by the piston rod 108. This forward movement of the carriage 87 causes the head 35 of the lead 20 to be pressed against the solder terminal 16 on the end of the capacitor 15 and melt the solder and embed itself therein. The carriage 87 holds the lead in engagement with the terminal for a predetermined period of time after the electrodes have been disconnected from the source of electrical potential to allow the lead 20 and the solder to cool and effect the bonding of the lead 20 to the solder terminal 16 of the capacitor.

Thereafter a cam 137 on the drive shaft 33 actuates a switch 138 in response to which the valve 101 is reversed to effect the reverse operation of the actuator 100 and the retraction of the lower electrode 23 from the lead. The switch 134 is then reversed under control of the cam 133 to effect the reversal of the valve 109, the reversal of movement of the actuator 107, and the return of the carriage 87 to tis normal retracted position. The carrier 29 is then indexed to advance the following holder 28 and another capacitor body 15 to the lead attaching station 17 preparatory to the next cycle of operation.

It is to be understood that the above-described arrangements are simply illustrative of the application of the principles of this invention. Numerous other arrangements may be readily devised by those skilled in the art which will embody the principles of the invention and fall within the spirit and scope thereof.

What is claimed is:

1. In an apparatus for attaching leads to electrical components:

means for holding a component in a predetermined position in alignment with an axis;

a pair of electrodes disposed on opposite sides of said axis adjacent to the component for gripping a lead therebetween;

means for feeding a lead transversely of said axis to a forward position with the lead coaxial with the axis and in a position between said electrodes;

means for supporting said electrodes for relative movement therebetween to grip the lead adjacent the leading end thereof and for movement parallel to the axis;

means connected to said electrodes for effecting the heating of the lead; and means for effecting the sequential actuation of said electrodes to cause gripping engagement of said electrodes with the lead and the axial movement of the lead against the component.

2. In an apparatus for attaching leads to electrical components:

means for holding a component in a fixed position in alignment with an axis;

a carriage mounted for movement parallel to said axis to and from a retracted position;

a first electrode mounted on said carriage for axial movement therewith on one side and in close proximity to the axis;

a second electrode mounted on said carriage on the other side of the axis for axial movement with the carriage and for movement transversely of the axis toward said first electrode for gripping the lead therebetween;

means for feeding a lead transversely of the axis to a transfer position coaxial with the axis and in a position between said electrodes;

means on said carriage for actuating said second electrode to grip the lead against the first electrode;

means for connecting said electrodes to a source of electrical potential to effect the heating of the lead; and means for moving said carriage parallel to said axis to press the end of the lead against the component.

3. An apparatus for attaching leads to electrical components comprising:

means for holding a component in a predetermined position in alignment with an axis;

a pair of electrodes disposed on opposite sides of said axis adjacent to the component in said holding means for gripping the lead therebetween;

means for supporting a lead in parallel relation to said axis and for movement transversely of said axis to and from a loading position;

means for feeding a lead into said lead supporting means at the loading position;

means for moving said lead supporting means from the loading position to a transfer position with the lead coaxial with the axis and between said electrodes;

means for actuating said electrodes to grip and support the lead on said axis;

means responsive to the actuation of said electrodes into gripping engagement with the lead for effecting the movement of said lead supporting means from the transfer position;

means for connecting said electrodes to a source of electrical potential to effect the heating of the lead; and means for moving said electrodes with the lead gripped therebetween parallel to said axis to press the end of the lead against the component.

4. An apparatus for attaching leads to electrical components comprising:

means for supporting a component in a fixed position in alignment with a first axis;

pneumatic means including a guide for advancing a lead longitudinally toward the component on said supporting means along a second axis parallel to and laterally disposed relative to said first axis;

stationary means for stopping the lead at a predetermined position with the end thereof disposed adjacent to the component;

a pair of electrodes disposed on opposite sides of said first axis adjacent to the component on said supporting means;

transfer means for moving the lead from said second axis to said first axis and between said electrodes;

means for actuating said electrodes to grip and support the lead on said first axis;

means for connecting said electrodes to a source of electrical potential for heating the leads; and means for moving said electrodes with the lead gripped therebetween to press the end of the lead against the component.

5. A lead attaching apparatus comprising:

means for supporting an electrical component in a predetermined position in alignment with an axis;

a first electrode;

a carriage for supporting said electrode in close proximity to said axis and adjacent to the component in said supporting means;

mounting means for supporting said carriage for movement parallel to said axis;

a first jaw supported on said mounting means for movement toward said axis and having a seat for supporting the lead parallel to said axis;

means for feeding a lead onto the seat of said first jaw;

a second jaw connected to said first jaw for movement therewith and for movement relative thereto to open and closed positions;

means for moving said second jaw to effect the closing of said second jaw and the movement of the jaws to a forward position with the lead coaxial with said axis and in engagement with said first electrode;

a second electrode mounted on said carriage;

means on said carriage for moving said second electrode to grip the lead against said first electrode;

means for connecting said electrodes to a source of electrical current to effect the heating of the lead; and means for moving said carriage to effect the movement of the lead into engagement with the component.

6. An apparatus for attaching leads to electrical components comprising:

means for supporting a component in a predetermined position in alignment with an axis;

a first electrode;

a carriage for supporting said first electrode in close proximity to said axis and adjacent to the component on said supporting means;

mounting means for supporting said carriage for movement parallel to said axis;

a first transfer jaw supported on said mounting means for movement toward said axis from a loading position and having a seat for supporting the lead parallel to said axis;

means for feeding a lead in a direction parallel to said axis onto said first transfer jaw;

means on said mounting means for stopping the lead in a predetermined position on said jaw and relative to the component on said supporting means;

a second transfer jaw connected to said first jaw for movement therewith and for pivotal movement relative thereto;

a first actuating means for reciprocating said second transfer jaw and operable in response to movement of said first jaw in one direction to effect the closing of said first jaw and the movement of the jaws to a forward position with the lead coaxial with said axis and in a position to be gripped by said first electrode and operable in response to movement of said jaw in the reverse direction to effect the opening of said first jaw and the retraction of said jaws to the loading position;

a second electrode;

a second actuating means for moving said second electrode to effect the gripping of the lead between said electrodes;

means for connecting said electrodes to a source of electrical potential to effect the heating of the lead;

a third actuating means for moving said carriage to effect the movement of the lead axially into engagement with the component; and means for effecting the sequential actuation of said first, said second, and said third actuating means.

7. In an apparatus for attaching leads to electrical components wherein each lead has a shank and a head on one end thereof:

means for supporting a component in a predetermined position in alignment with a first axis;

a first transfer jaw having a rabbeted end portion for supporting the shank of the lead thereon parallel to said first axis;

mounting means for supporting said transfer jaw for movement transversely of said first axis to a forward position with the lead coaxial with said first axis and to a retracted position;

a second jaw mounted on said first jaw for movement therewith and for pivotal movement thereon about a second axis to a closed position and to an open position and having a rabbeted end portion cooperable with said rabbeted end portion of said first jaw when said second jaw is in closed position to form a nest for supporting the lead in a predetermined position on said first jaw in parallel relation to said first axis, said second jaw being movable to an intermediate position with the rabbeted ends of said jaws forming a passageway for guiding the headed end of the lead therethrough;

means for feeding a lead head first in a direction parallel to said first axis into the passageway of said jaws at the retracted position and for stopping the lead with the shank supported on said first jaw;

actuating means on said mounting means having a piston rod pivotally connected to said second jaw intermediate said second axis and an extremity of said jaw for moving said jaw toward and away from said first axis, said second jaw being operable in response to advance movement of the piston rod to pivot to closed position to grip the shank of the lead against said first jaw and to advance the jaws to said forward position and being operable in response to return movement of said piston rod to pivot to open position and to return said jaws to said retracted position;

a stop on said mounting means engageable with said extremity of said second jaw for arresting the movement of said extremity slightly prior to the arrival of said first jaw to the retracted position to effect the movement of said first jaw to the intermediate position as said first jaw reaches said retracted position;

a pair of relatively movable electrodes connectible to a source of electrical potential and disposed on opposite sides of said axis adjacent to a component in said component supporting means; and means for actuating said electrodes to grip a lead on said axis and to move the lead axially against the component.

8. In an apparatus for attaching leads to electrical components wherein each lead has a shank and a head on one end thereof:

means for supporting an electrical component in a predetermined position in alignment with the first axis;

a feed tube mounted in laterally spaced and parallel relation to said axis and having compressed air flowing therethrough for feeding the lead head first toward said component;

means for stopping the lead with the head thereof adjacent the electrical component;

a lower jaw having a rabbeted end portion for supporting the shank of the lead thereon;

an upper jaw pivotally mounted on said lower jaw for limited pivotal movement relative thereto about a second pivot to a closed position and to an open position and having a rabbeted end portion cooperable with said rabbeted end portion of the lower jaw to form a nest for gripping and positioning the shank of the lead in a predetermined location thereon when said upper jaw is in the closed position, said upper jaw being movable to an intermediate position wherein said rabbeted end portions cooperate to form a passageway for guiding the head of the lead therethrough;

mounting means for supporting said lower jaw for movement to a retracted position in alignment with said feed tube for receiving the lead and to a forward position with the lead coincident with the axis;

an actuator on said mounting means having a piston rod pivotally connected to said upper jaw intermediate the second pivot and an extremity of the upper jaw operable in response to forward movement of the piston rod to move the jaw to closed position and advance the jaws to the forward position and operable in response to return movement of said piston rod to pivot the upper jaw to open position and move said jaws to retracted position;

means engageable with said extremity of the upper jaw to stop the movement thereof as the lower jaw approaches its retracted position to effect the pivoting of the upper jaw to the intermediate position as the lower jaw reaches the retracted position;

electrode means for gripping the lead on the first axis and adjacent the head of the lead in response to movement of the jaws to said forward position;

means responsive to the gripping of the lead by said electrode means for effecting the operation of said actuator and the return movement of said jaws to retracted position;

means associated with said electrode means for effecting the heating of the lead; and means for moving said electrode means and the lead gripped thereby parallel to the axis to press the lead against the component.

References Cited by the Examiner

UNITED STATES PATENTS

| | | | |
|---|---|---|---|
| 2,606,268 | 8/1952 | Pityo et al. | 219—103 X |
| 2,794,899 | 6/1957 | Plummer | 219—85 X |
| 2,806,934 | 9/1957 | Andersson et al. | 219—103 |

RICHARD M. WOOD, *Primary Examiner.*

B. A. STEIN, *Assistant Examiner.*